US008624643B2

(12) United States Patent
Choi

(10) Patent No.: US 8,624,643 B2
(45) Date of Patent: Jan. 7, 2014

(54) SEMICONDUCTOR MEMORY APPARATUS

(75) Inventor: Hoon Choi, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 1286 days.

(21) Appl. No.: 11/824,360

(22) Filed: Jun. 29, 2007

(65) Prior Publication Data

US 2008/0054947 A1 Mar. 6, 2008

(30) Foreign Application Priority Data

Sep. 1, 2006 (KR) .................. 10-2006-0084103

(51) Int. Cl.
  *H03L 7/06* (2006.01)
(52) U.S. Cl.
  USPC .......................................... 327/158; 327/156
(58) Field of Classification Search
  USPC .................................. 327/147–149, 156–158
  See application file for complete search history.

(56) References Cited

U.S. PATENT DOCUMENTS

| 7,184,509 B2 * | 2/2007 | Cho et al. ................. 375/373 |
| 2007/0046346 A1 * | 3/2007 | Minzoni ................. 327/158 |
| 2008/0012615 A1 * | 1/2008 | Park ................. 327/158 |

FOREIGN PATENT DOCUMENTS

| JP | 2003-101409 A | 4/2003 |
| JP | 2004-103220 A | 4/2004 |
| JP | 2005-135567 A | 5/2005 |
| KR | 10-2006-0114234 | 11/2006 |

* cited by examiner

*Primary Examiner* — Lincoln Donovan
*Assistant Examiner* — Diana J Cheng
(74) *Attorney, Agent, or Firm* — Blakely, Sokoloff, Taylor & Zafman

(57) ABSTRACT

A semiconductor memory apparatus includes a phase comparator configured to compare phases of rising and falling feedback clocks with that of a reference clock, a delay circuit configured to delay the reference clock by a predetermined time based on a comparison result of the phase comparator to thereby generate rising and falling delayed clocks, a clock transmission block configured to invert the rising delayed clock outputted from the delay circuit when the rising and falling feedback clocks have substantially different phases, a duty compensator configured to compensate a duty ratio from outputs of the clock transmitting block to generate a delay locked clock having a compensated duty ratio, and a delay model configured to delay an output and an inverse output of the duty compensator by a modeled delay time respectively to generate the rising and falling feedback clocks.

20 Claims, 8 Drawing Sheets ern patent application number 10-2006-0084103, filed on Sep. 1, 2006,
which is incorporated by reference in its entirety.

SEMICONDUCTOR MEMORY APPARATUS

CROSS-REFERENCE TO RELATED APPLICATIONS

The present invention claims priority of Korean patent application number 10-2006-0084103, filed on Sep. 1, 2006, which is incorporated by reference in its entirety.

BACKGROUND OF THE INVENTION

The present invention relates to a semiconductor device, and more particular, to a semiconductor memory apparatus with a delay locked loop circuit.

A semiconductor memory apparatus embodied in a system which includes a plurality of semiconductor devices is used for storing data. The semiconductor memory apparatus outputs data stored in a cell corresponding to an address outputted from a data requesting unit such as a central processing unit (CPU) or stores data provided from the data requesting unit into the cell.

As an operational speed of a system including a plurality of semiconductor devices has increased and a technology related to a semiconductor integrated circuit has advanced, there has been a demand for increasing data access speed of the semiconductor memory apparatus. In order to access data of semiconductor memory apparatus with a high speed, a synchronous memory device which receives a system clock and can access data every time synchronized with transition of the received system clock has been proposed. Nevertheless, the synchronous memory device cannot meet data access speed required by the system, particularly, the data requesting unit included in the system. Accordingly, a double data rate (DDR) synchronous semiconductor memory apparatus is proposed which can access data every rising edge and falling edge of the system clock.

The DDR synchronous semiconductor memory apparatus should receive or output two data within one cycle of the system clock, since the DDR synchronous semiconductor memory apparatus accesses one data every transition of the system clock. That is, the DDR synchronous semiconductor memory apparatus should output or receive data every time exactly synchronized with the rising edge and falling edge of the system clock. Typically, the output circuit of the DDR synchronous semiconductor memory apparatus receives the system clock through a clock transfer path including a clock buffer, clock transmission lines, and the like inside the DDR synchronous semiconductor memory apparatus and outputs data synchronized with the received system clock.

However, the system clock reaches the output circuit of the DDR synchronous semiconductor memory apparatus with an essential delay occurring while passing through the clock input buffer and the clock signal transmission lines arranged in the DDR synchronous semiconductor memory apparatus. Although the output circuit outputs data in synchronization with the reached system clock, data delayed by the essential delay are inputted to an external device receiving data from the DDR synchronous semiconductor memory apparatus.

To solve above described problem, the DDR synchronous semiconductor memory apparatus includes a circuit, i.e., a delay locked loop circuit for adjusting the essential delay by locking a delay of the transferred system clock. The delay locked loop compensates for a delay value caused by the clock transfer path of the semiconductor memory apparatus. The delay locked loop circuit detects a delay value while an inputted system clock passes through the clock transfer path including the clock input circuit, the clock signal transmission lines, and the like and delays the inputted system clock for a delay time corresponding to the detected delay value to thereby output the delayed system clock into the output circuit. That is, the delay locked loop circuit intentionally delays and locks the inputted system clock by a constant delay value depending on an amount of the detected delay value to output the delay locked clock into the output circuit. Then, the output circuit outputs a data synchronized with the delay locked clock. The data outputted from the output circuit is exactly transferred to the external device, synchronized with the system clock.

Substantially, the delay locked clock is inputted to the output circuit at one previous cycle before the data is outputted; and, synchronized with the delay locked clock, the output circuit outputs the data. Namely, for synchronizing the outputted data with the system clock, the data should be outputted faster than the system clock is delayed on the clock transfer path. Outside the semiconductor memory apparatus, the outputted data are exactly synchronized with rising and falling edges of the system clock, input to the semiconductor memory apparatus. Consequently, the delay locked loop is a circuit for determining how much the data is outputted faster than the timing of data output in order to compensate the delay value of the system clock inside the semiconductor memory apparatus.

FIG. 1 illustrates a timing diagram describing an operation of a delay locked loop for use in a conventional semiconductor memory apparatus.

As shown, the delay locked loop generates a delay locked clock DLL_OUT whose phase leads that of inputted internal clock CLKI. Herein, the internal clock CLKI is generated based on an external clock CLK0 from a clock buffer or an internal clock generator. The semiconductor memory apparatus outputs data D0, D1, and D2, synchronized with the delay locked clock DLL_OUT. If the data D0, D1, and D2 are synchronized with the delay locked clock DLL_OUT, the data can be also synchronized with the external clock CLK0.

Generally, the delay locked loop includes a delay line for delaying an internal clock, a delay line controller for controlling a delay amount of the delay line, a delay model for delaying an output of the delay line by an estimated amount, i.e., how long time the internal clock is delayed by a clock path inside the semiconductor memory apparatus, and a phase comparator for comparing a phase of the internal clock with that of an output of the delay model.

Meanwhile, as a frequency of system clock inputted to the semiconductor memory apparatus is higher, an operation margin for outputting data decreases in the DDR synchronous semiconductor memory apparatus which outputs plural data in synchronization with rising and falling edges of the system clock. Thus, it is important to adjust a duty ratio of the delay locked clock outputted from the delay locked loop in the semiconductor memory apparatus. If the duty ratio of the delay locked clock is set to 50:50, the semiconductor memory apparatus has a stable operation margin for outputting data. Recently, the delay locked loop in the semiconductor memory apparatus includes a circuit for adjusting or controlling a duty ratio of the delay locked clock.

However, it is difficult to output the delay locked clock having an adjusted duty ratio of 50:50 because of a temperature variation and a fluctuation of inputted power voltage level during an operation of the semiconductor memory apparatus and a change of circumstance and condition on operation of a system having the semiconductor memory apparatus. If the duty ratio of the delay locked clock outputted from the delay locked loop is not set or fixed properly, the operation margin for outputting data becomes unstable and, as a result, the semiconductor memory apparatus cannot output all data to an external device at every desirably timing, i.e., the rising and falling edges of the system clock.

SUMMARY OF THE INVENTION

Embodiments of the present invention are directed to provide a semiconductor memory apparatus including a delay locked loop to generate a delay locked clock having a constant duty ratio regardless of a temperature variation and a fluctuation of inputted power voltage level during an operation of the semiconductor memory apparatus and a change of circumstance and condition on operation of a system having the semiconductor memory apparatus.

In accordance with an aspect of the present invention, there is provided a semiconductor memory apparatus including a phase comparator configured to compare phases of rising and falling feedback clocks with that of a reference clock, a delay circuit configured to delay the reference clock by a predetermined time based on a comparison result of the phase comparator to thereby generate rising and falling delayed clocks, a clock transmission block configured to invert the rising delayed clock outputted from the delay circuit when the rising and falling feedback clocks have substantially different phases, a duty compensator configured to compensate a duty ratio from outputs of the clock transmitting block to generate a delay locked clock having a compensated duty ratio, and a delay model configured to delay an output and an inverse output of the duty compensator by a modeled delay time respectively to generate the rising and falling feedback clocks.

In accordance with another aspect of the present invention, there is provided a semiconductor memory apparatus including a phase comparator configured to generate first and second control signals based on differences between phases of rising and falling feedback clocks and that of a reference clock, a delay line configured to delay the reference clock by a predetermined time based on the first and second control signals to thereby generate rising and falling delayed clocks, a duty compensation block configured to compensate a duty ratio from an inverted rising delayed clock and the falling delayed clock when the rising and falling feedback clocks have substantially same phases and from the rising and falling delayed clocks when the rising and falling feedback clocks have substantially different phases to thereby generate rising and falling delay locked clocks, each having compensated duty ratio, and a delay model configured to delay the rising and falling delay locked clocks outputted from the duty compensation by a modeled delay time respectively to generate the rising and falling feedback clocks.

In accordance with another aspect of the present invention, there is provided a method for generating a delay locked clock having a compensated duty ratio from an semiconductor memory apparatus, including comparing phases of rising and falling feedback clocks with that of a reference clock, delaying the reference clock by a predetermined time based on a comparison result of the phase comparator to thereby generate rising and falling delayed clocks, inverting the rising delayed clock outputted from the delay circuit when the rising and falling feedback clocks have substantially different phases, compensating a duty ratio from outputs of the clock transmitting block to generate a delay locked clock having a compensated duty ratio, and delaying an output and an inverse output of the duty compensator by a modeled delay time respectively to generate the rising and falling feedback clocks.

In accordance with another aspect of the present invention, there is provided a method for generating a delay locked clock having a compensated duty ratio from a semiconductor memory apparatus, including generating first and second control signals based on differences between phases of rising and falling feedback clocks and that of a reference clock, delaying the reference clock by a predetermined time based on the first and second control signals to thereby generate rising and falling delayed clocks, compensating a duty ratio from an inverted rising delayed clock and the falling delayed clock when the rising and falling feedback clocks have substantially same phases and from the rising and falling delayed clocks when the rising and falling feedback clocks have substantially different phases to thereby generate rising and falling delay locked clocks, each having compensated duty ratio, and delaying the rising and falling delay locked clocks outputted from the duty compensation by a modeled delay time respectively to generate the rising and falling feedback clocks.

In accordance with another aspect of the present invention, there is provided a semiconductor memory apparatus including a phase comparator configured to compare phases of rising and falling feedback clocks with that of a reference clock, a delay line configured to delay the reference clock by a predetermined time to thereby generate rising and falling delayed clocks, a delay controller configured to control the predetermined time of the delay line in response to a comparison result of the phase comparator, a clock transmission block configured to invert the rising delayed clock outputted from the delay circuit when the rising and falling feedback clocks have substantially different phases and buffer the rising and falling delayed clocks when the rising and falling feedback clocks have substantially same phases to thereby output as a delay locked clock, and a delay model configured to delay outputs from the clock transmission block by a modeled delay time respectively to generate the rising and falling feedback clocks.

DESCRIPTION OF SPECIFIC EMBODIMENTS

In accordance with an embodiment of the present invention, a semiconductor memory apparatus can provide stable delay locked clock from a delay locked loop regardless of a temperature variation and a fluctuation of inputted power voltage level during an operation of the semiconductor memory apparatus and a change of circumstance and condition on operation of a system having the semiconductor memory apparatus. Further, occasions when the delay locked loop outputs a delay locked clock which does not have a duty ratio of 50:50 may be dramatically reduced.

Hereinafter, a semiconductor memory apparatus in accordance with specific embodiments of the present invention will be described in detail with reference to the accompanying drawings.

Figure 1:
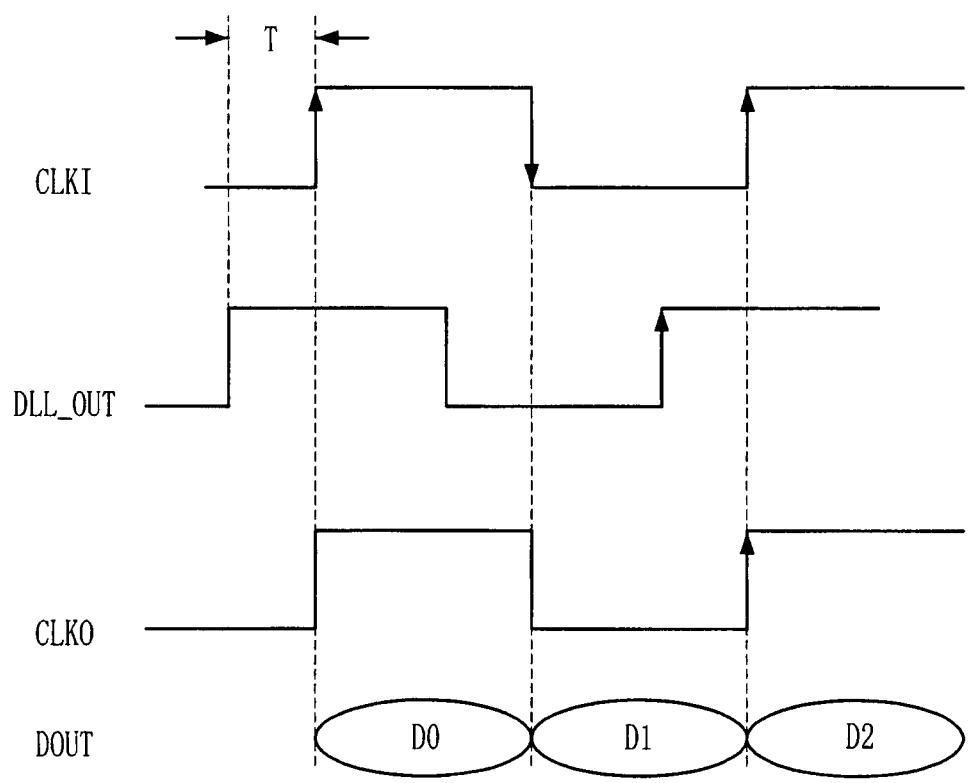
FIG. 1 illustrates a timing diagram describing an operation of a delay locked loop for use in a conventional semiconductor memory apparatus.
Figure 2:
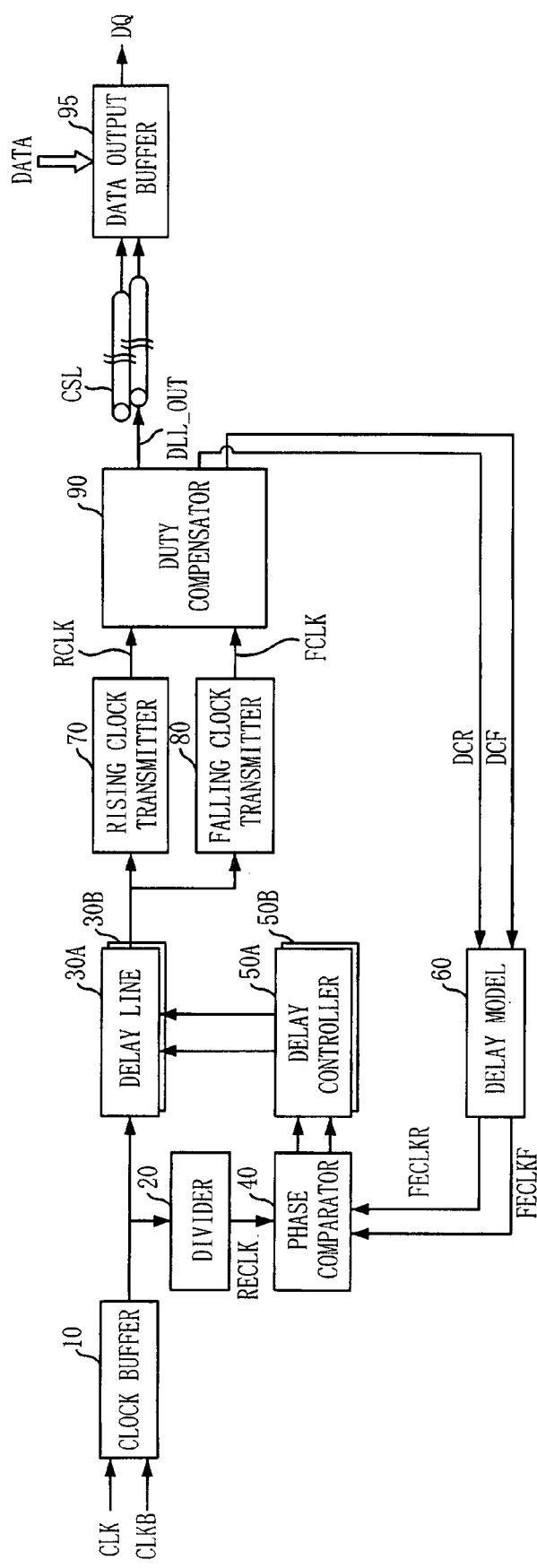
FIG. 2 illustrates a block diagram of a semiconductor memory apparatus according to an embodiment of the present invention.

FIG. 2 illustrates a block diagram of a semiconductor memory apparatus according to an embodiment of the present invention.

The semiconductor memory apparatus includes a clock buffer 10, a divider 20, delay lines 30A and 30B, a phase comparator 40, delay controller 50A and 50B, a delay model 60, a rising clock transmitter 70, a falling clock transmitter 80, a duty compensator 90, a transmission line CSL, and a data output buffer 95.

The clock buffer 10 delivers inputted clocks CLK and CLKB into the delay lines 30A and 30B and the divider 20. The divider 20 divides an output of the clock buffer 10 by 1/N, wherein N is a positive integer, generally 8 or 4 to generate a reference clock RECLK to the phase comparator 40. Herein, it can reduce power consumption for generating a delay locked clock that the semiconductor memory apparatus uses a divided clock outputted from the divider 20. The delay lines 30A and 30B delay the output of the clock buffer 10 by a predetermined time to thereby generate rising and falling delayed clocks. In detail, the delay lines 30A and 30B respectively delay the inputted clocks CLK and CLKB having opposite phases.

The phase comparator 40 compares phases of rising and falling feedback clocks FECLKR and FECLKF with that of the reference clock RECLK to thereby output a comparison result into the delay controllers 50A and 50B. The delay controller 50A and 50B control the predetermined time of the delay lines 30A and 30B in response to the comparison result of the phase comparator 40.

Herein, the delay lines and the delay controllers are generally called a delay circuit for delaying the inputted clock by a predetermined time based on a comparison result of the phase comparator to thereby generate rising and falling delayed clocks.

The delay model 60 delays outputs of the duty compensator 90 by a modeled delay time to generate the rising and falling feedback clocks FECLKR and FECLKF. Herein, the modeled delay time means an estimated amount how long time the internal clock is delayed by a clock path inside the semiconductor memory apparatus. The rising clock transmitter 70 and the falling clock transmitter 80 deliver the rising and falling delayed clocks outputted from the delay lines 30A and 30B into the duty compensator 90. In detail, the rising clock transmitter 70 buffers the rising delayed clock to output as a rising clock RCLK, and the falling clock transmitter 80 inverts the falling delayed clock to output as a falling clock FCLK into the duty compensator 90.

The duty compensator 90 compensates a duty ratio from outputs of the clock transmitting block to generate a delay locked clock DLL_OUT having a compensated duty ratio. That is, the duty compensator 90 adjusts the duty ratio of the rising clock RCLK and the falling clock FCLK to thereby output the delay locked clock DLL_OUT to the data output buffer 95 throughout the transmission line CSL. The data output buffer 95 outputs data DATA from cells corresponding to inputted addresses and commands in synchronization with transitions of the delay locked clock DLL_OUT.

The phase comparator 40 compares the phases of the rising and falling feedback clocks FECLKR and FECLKF with that of the reference clock RECLK until the rising and falling feedback clocks FECLKR and FECLKF and the reference clock RECLK have substantially same phases. According to this comparison result of the phase comparator 40, the delay controllers 50A and 50B controls a delay amount of the delay lines 30A and 30B. If the rising and falling feedback clocks FECLKR and FECLKF and the reference clock RECLK have substantially same phases, the delay controllers 50A and 50B do not adjust the delay amount of the delay lines 30A and 30B further. At this time, outputs of the delay lines 30A and 30B can be considered as the delay locked clock.

Figure 3:
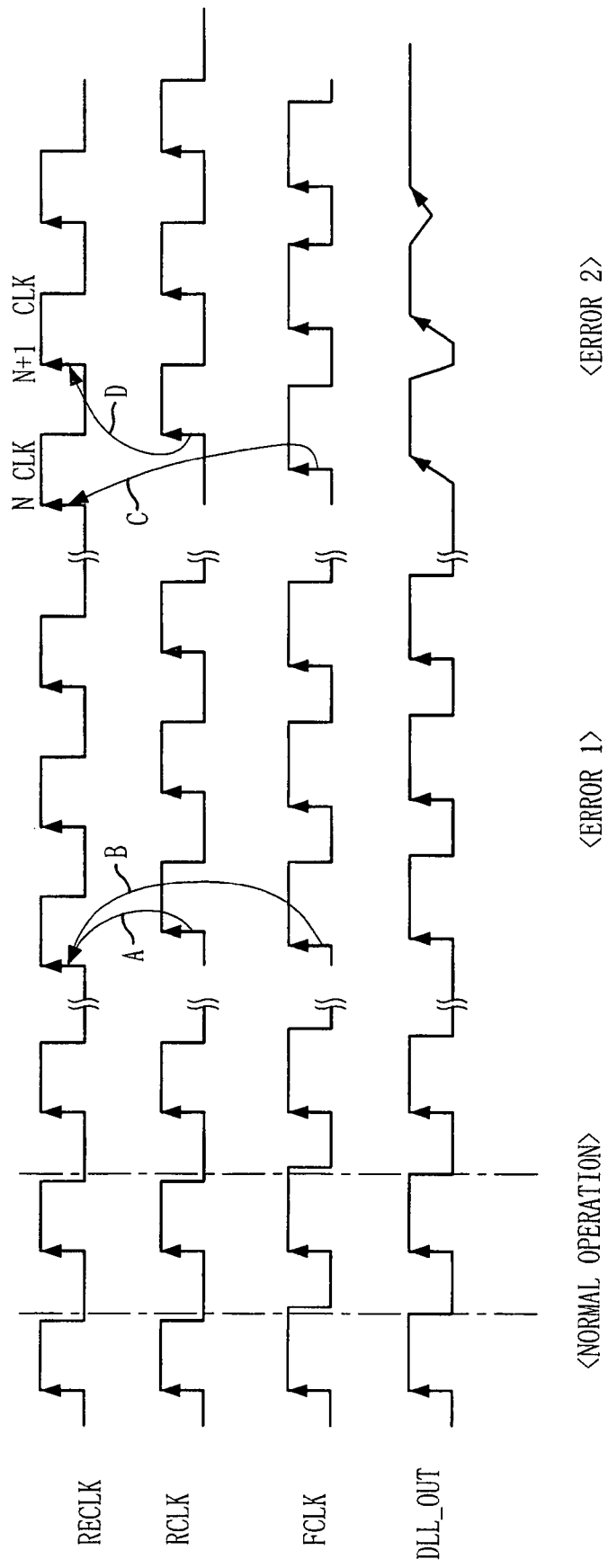
FIG. 3 illustrates a timing diagram describing an operation of the semiconductor memory apparatus shown in FIG. 2.

FIG. 3 illustrates a timing diagram describing an operation of the semiconductor memory apparatus shown in FIG. 2. Particularly, FIG. 3 depicts the operation of the semiconductor memory apparatus according to a temperature variation and a fluctuation of inputted power voltage level during an operation of the semiconductor memory apparatus and a change of circumstance and condition on operation of a system having the semiconductor memory apparatus.

First, there is a normal operation when the temperature variation, the fluctuation of inputted power voltage level, and the change of circumstance and condition are calm. After terminating an operation of delay locked loop, the reference clock RECLK is synchronized with the rising and falling clocks RCLK and FCLK and a locking state is achieved. Then, the duty compensator 90 adjust a duty ratio of the rising and falling clocks RCLK and FCLK to thereby generate the delay locked clock DLL_OUT.

Secondly, there is another case ERROR 1 when the temperature variation, the fluctuation of inputted power voltage level, and the change of circumstance and condition are unstable because of starting and finishing a power down mode repeatedly. In this case, phase differences A and B between the reference clock RECLK and the rising and falling clocks RCLK and FCLK may be over a capability of the duty compensator 90; but, if the phase differences A and B are not over the capability of the duty compensator 90, the duty ratio can be controlled by the duty compensator 90.

Lastly, there is another case ERROR 2 when the temperature variation, the fluctuation of inputted power voltage level, and the change of circumstance and condition are dramatically shaken. In this case, it is possible for the duty compensate 90 not to control the duty ratio based on the rising and falling clocks RCLK and FCLK.

For example, if phase variations of the rising and falling clocks RCLK and FCLK are over a half cycle of the reference clock RECLK, the semiconductor memory apparatus may perform a delay locking operation again to achieve the locking state based on a Nth edge of the rising clock RCLK and a (N+1)th edge of the reference clock RECLK. As a result, a phase difference between the rising clock RCLK and the falling clock FCLK can be a half cycle, and then the duty compensator 90 cannot be adjust or compensate the duty ratio of the rising and falling clocks RCLK and FCLK because of a big phase difference.

For overcoming above described problem, in another embodiment of the present invention, the duty compensator receives the rising and falling clocks RCLK and FCLK to adjust the duty ratio when the rising and falling clocks RCLK and FCLK have substantially same phases. However, when the rising and falling clocks RCLK and FCLK have substantially different phases, the duty compensator receives the rising and falling clocks RCLK and FCLK and adjust the duty ratio after one of the rising and falling clocks RCLK and FCLK is inverted.

Figure 4:
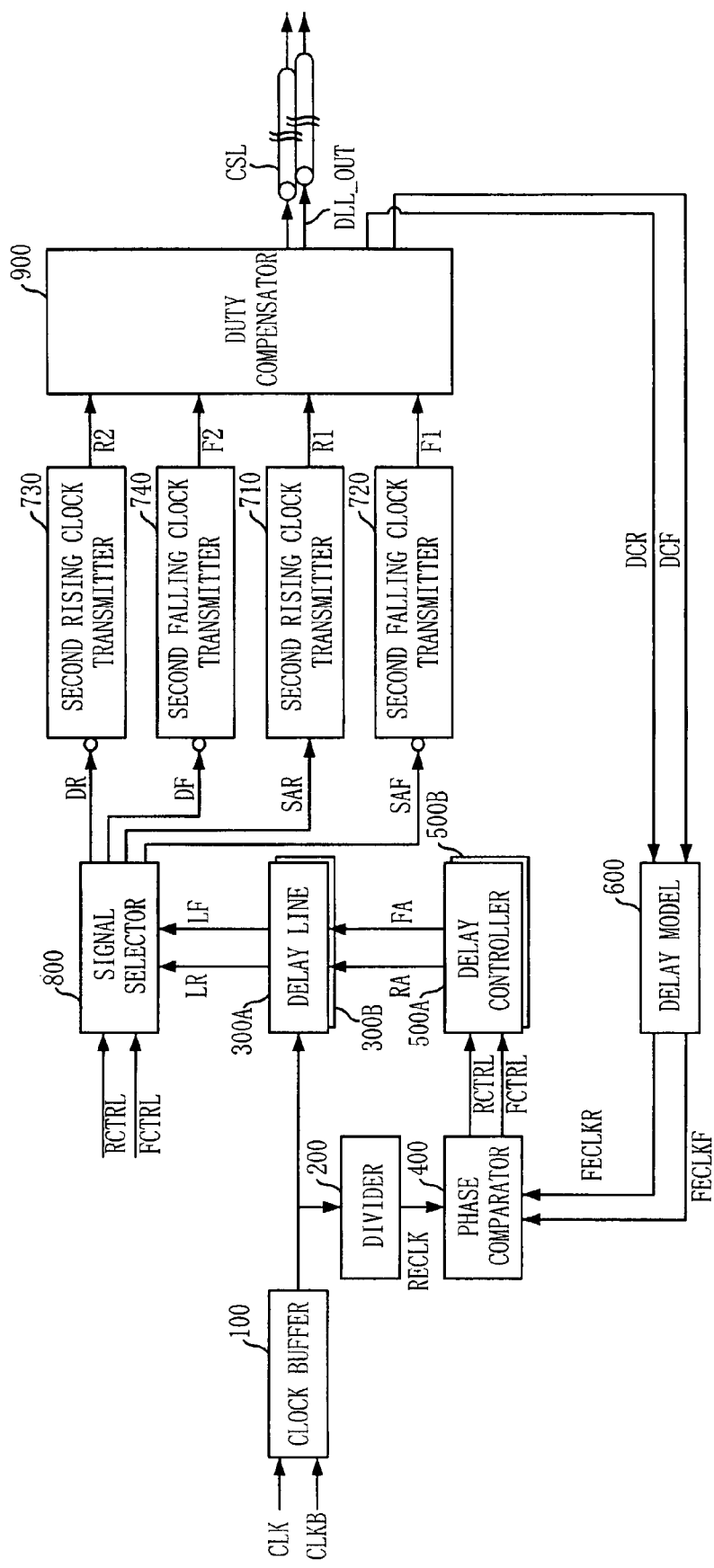
FIG. 4 illustrates a block diagram of a semiconductor memory apparatus according to another embodiment of the present invention.

FIG. 4 illustrates a block diagram of a semiconductor memory apparatus according to another embodiment of the present invention.

The semiconductor memory apparatus includes a clock buffer 100, a divider 200, delay lines 300A and 300B, a phase comparator 400, delay controller 500A and 500B, a delay model 600, a first rising clock transmitter 710, a first falling clock transmitter 720, a second rising clock transmitter 730, a second falling clock transmitter 740, a duty compensator 900, a transmission line CSL, and a signal selector 800.

The clock buffer 100 delivers inputted clocks CLK and CLKB into the delay lines 300A and 300B and the divider 200. The divider 200 divides an output of the clock buffer 100 by 1/N, wherein N is a positive integer, generally 8 or 4 to generate a reference clock RECLK to the phase comparator 400. Herein, it can reduce power consumption for generating a delay locked clock that the semiconductor memory apparatus uses as a divided clock outputted from the divider 200. The delay lines 300A and 300B delay the output of the clock buffer 100 by a predetermined time to thereby generate rising and falling delayed clocks LR and LF. In detail, the delay lines 300A and 300B respectively delay the inputted clocks CLK and CLKB having opposite phases.

The phase comparator 400 compares phases of rising and falling feedback clocks FECLKR and FECLKF with that of the reference clock RECLK to thereby output a comparison result RCTRL and FCTRL into the delay controllers 500A and 500B. The delay controller 500A and 500B generate delay control signals RA and FA to thereby control the predetermined time of the delay lines 300A and 300B in response to the comparison result of the phase comparator 400.

The delay model 600 delays outputs DCR and DCF from the duty compensator 900 by a modeled delay time to generate the rising and falling feedback clocks FECLKR and FECLKF. Herein, the modeled delay time means an estimated amount of how long the internal clock is delayed by a clock path inside the semiconductor memory apparatus.

A clock transmission block including a first rising clock transmitter 710, a first falling clock transmitter 720, a second rising clock transmitter 730, and a second falling clock transmitter 740 delivers the rising and falling delayed clocks outputted from the delay lines 300A and 300B into the duty compensator 900.

The signal selector 800 outputs the rising and falling delayed clocks LR and LF as either first rising and falling clock signals SAR and SAF or second rising and falling clock signals DR and DF in response to the comparison result RCTRL and FCTRL from the phase comparator 400. The comparison result RCTRL and FCTRL originally indicate phase differences between the rising and falling feedback clocks FECLKR and FECLKF with the reference clock RECLK. Also, the comparison result RCTRL and FCTRL can indicate whether or not the rising and falling feedback clocks have substantially the same phases. If the rising and falling feedback clocks FECLKR and FECLKF have substantially the same phases, two signals RCTRL and FCTRL of the comparison result have the same level. Otherwise, if the rising and falling feedback clocks FECLKR and FECLKF have substantially different phases, the two signals RCTRL and FCTRL of the comparison result have different levels.

When the two signals RCTRL and FCTRL of the comparison result have the same level, i.e., the rising and falling feedback clocks FECLKR and FECLKF have substantially the same phases, the signal selector 800 outputs the rising and falling delayed clocks LR and LF as the first rising and falling clock signals SAR and SAF. On the contrary, when the two signals RCTRL and FCTRL of the comparison result have different levels, i.e., the rising and falling feedback clocks FECLKR and FECLKF have substantially different phases, the signal selector 800 outputs the rising and falling delayed clocks LR and LF as the second rising and falling clock signals DR and DF.

The first rising clock transmitter 710 transfers a buffering signal R1 of the first rising clock signal SAR to the duty compensator 900. The first falling clock transmitter 720 transfers an inverse signal F1 of the first falling clock signal to the duty compensator 900. Also, the second rising clock transmitter 730 transfers an inverse signal R2 of the second rising clock signal DR to the duty compensator 900, and the second falling clock transmitter 740 transfers an inverse signal F2 of the second falling clock signal DF.

The duty compensator 900 compensates a duty ratio from outputs of the clock transmitting block to generate a delay locked clock DLL_OUT having a compensated duty ratio. In detail, the duty compensator 900 generates the delay locked clock DLL_OUT by adjusting a duty ratio from either first rising and falling clock signals SAR and SAF or second rising and falling clock signals DR and DF. Herein, the inverse signals SAF and DF outputted from the first and second falling clock transmitters 720 and 740 can be used as a reference for duty compensation in the duty compensator 900. That is, the duty compensator 900 adjusts the duty ratio of the rising clock LR and the falling clock LF to thereby output the delay locked clock DLL_OUT to an external block throughout the transmission line CSL and the delay model 600 as the signals DCR and DCF.

The phase comparator 400 compares the phases of the rising and falling feedback clocks FECLKR and FECLKF with that of the reference clock RECLK until the rising and falling feedback clocks FECLKR and FECLKF and the reference clock RECLK have substantially the same phases. According to this comparison result of the phase comparator 400, the delay controllers 500A and 500B controls a delay amount of the delay lines 300A and 300B. If the rising and falling feedback clocks FECLKR and FECLKF and the reference clock RECLK have substantially the same phases, the delay controllers 500A and 500B do not adjust the delay amount of the delay lines 300A and 300B further. At this time, using outputs of the delay lines 300A and 300B, the duty compensator 900 adjusts a duty ratio to thereby generate the delay locked clock DLL_OUT.

Figure 5:
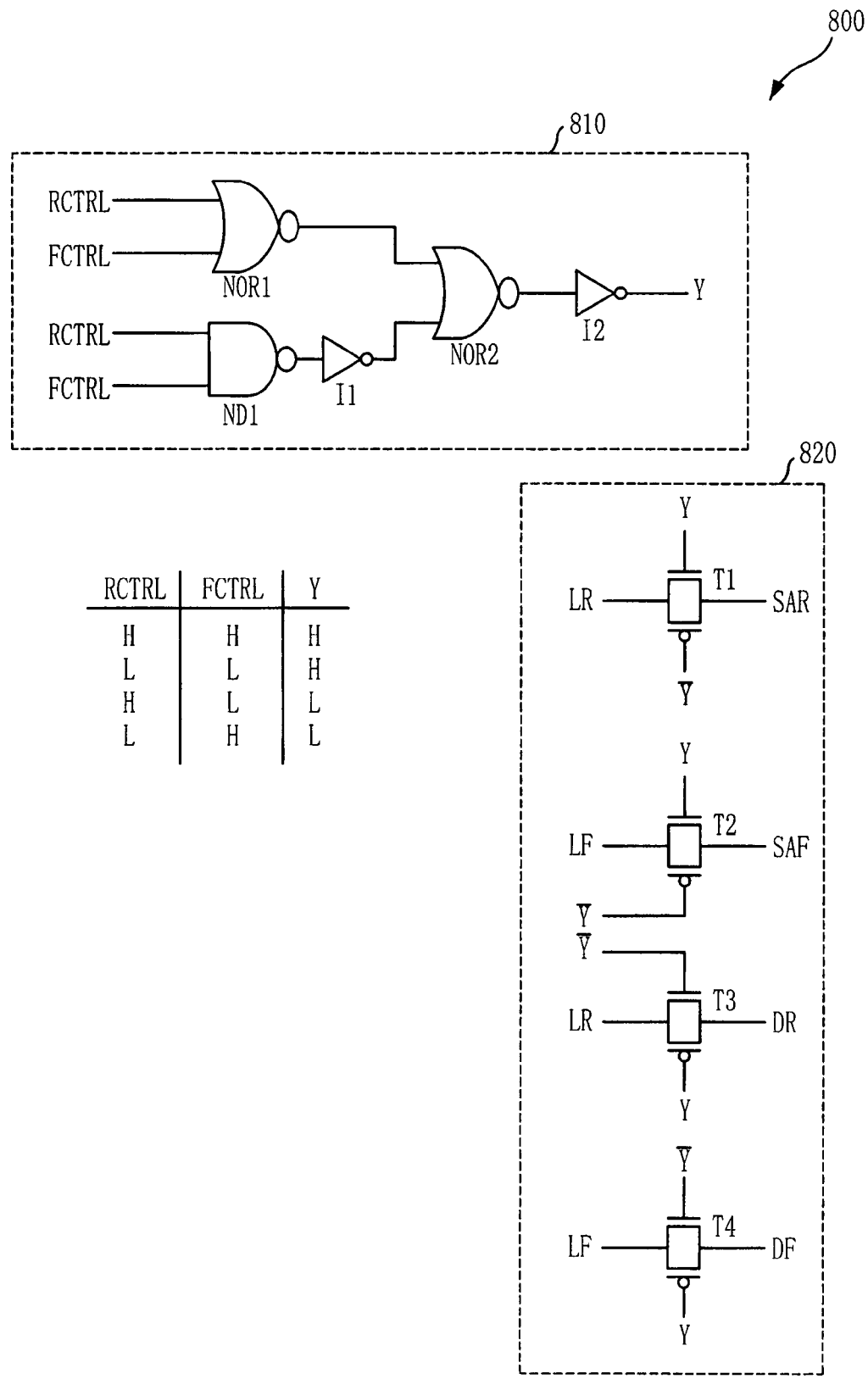
FIG. 5 illustrates a schematic circuit diagram of an embodiment of a signal selector in FIG. 4.

FIG. 5 illustrates a schematic circuit diagram of an embodiment of the signal selector 800 in FIG. 4.

As shown, the signal selector 800 includes a comparator 810 and a transfer block 820.

The comparator 810 generates a transfer control signal Y and /Y enabled when the rising and falling feedback clocks have substantially same phases. For generating the transfer control signal Y and /Y, the comparator 810 receives the two signals RCTRL and FCTRL of the comparison result outputted from the phase comparator 400. The comparator 810 includes plural logic gates for performing an exclusive OR operation to the outputs RCTRL and FCTRL of the phase comparator 400 to thereby detect a phase difference between the rising and falling feedback clocks FECLKR and FECLKF. Herein, the plural logic gates include logic NOR gates NOR1 and NOR2, a logic NAND gate ND1, and inverters I1 and I2.

The transfer block 820 includes a first transfer gate to transfer the rising delayed clock LR as the first rising clock signal SAR in response to a first logic level of the transfer control signal Y and /Y, a second transfer gate to transfer the falling delayed clock LF as the first falling clock signal SAF in response to the first logic level of the transfer control signal Y and /Y, a third transfer gate to transfer the rising delayed clock LR as the second rising clock signal DR in response to a second logic level of the transfer control signal Y and /Y, and a fourth transfer gate to transfer the falling delayed clock LF as the second falling clock signal DF in response to the second logic level of the transfer control signal Y and /Y.

Figure 6:
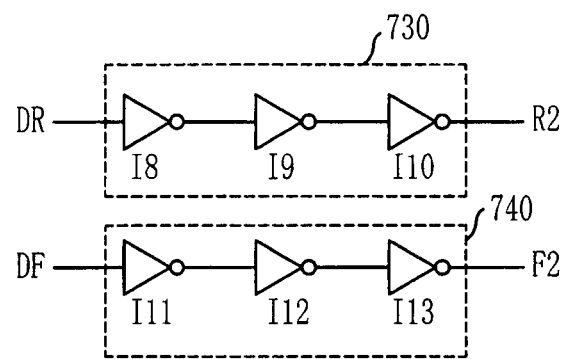
FIG. 6 illustrates a timing diagram describing an operation of the semiconductor memory apparatus shown in FIG. 4.
Figure 6:
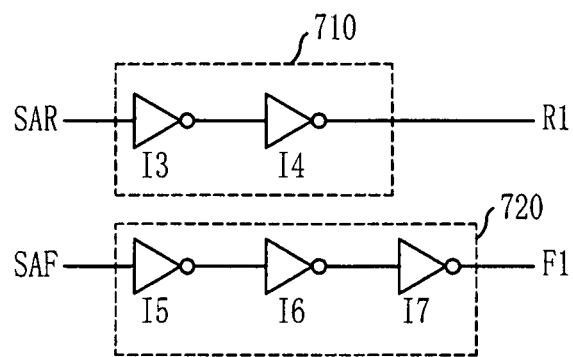

FIG. 6 illustrates a timing diagram describing an operation of the semiconductor memory apparatus shown in FIG. 4.

The semiconductor memory apparatus includes the signal selector 800 and four clock transmitters 710 to 740. When the two signals RCTRL and FCTRL of the comparison result have the same level, the signal selector 800 converts the rising and falling delayed clocks LR and LF outputted from the delay lines 300A and 300B as the first rising and falling clock signals SAR and SAF. If the two signals RCTRL and FCTRL of the comparison result have different levels, the rising and falling delayed clocks LR and LF are converted into the second rising and falling clock signals DR and DF.

If the signal selector 800 outputs the first rising and falling clock signals SAR and SAF, the first rising clock transmitter 710 buffers the first rising clock signal SAR and outputs to the duty compensator 900 and the first falling clock transmitter 720 inverts the first falling clock signal SAF and outputs to the duty compensator 900. Using inputted signals, the duty compensator 900 generates the delay locked signal DLL_OUT whose duty ratio is adjusted and compensated. The delay locked signal DLL_OUT is delivered into a data output buffer throughout the transmission line CSL. The data output buffer outputs data in synchronization with transitions of the delay locked clock DLL_OUT.

Likewise, if the signal selector 800 outputs the second rising and falling clock signals DR and DF, the second rising clock transmitter 730 inverts the second rising clock signal DR and outputs to the duty compensator 900 and the second falling clock transmitter 740 inverts the second falling clock signal DF and outputs to the duty compensator 900. Using these inverted signals, the duty compensator 900 generates the delay locked signal DLL_OUT whose duty ratio is adjusted and compensated.

Particularly, if the two signals RCTRL and FCTRL of the comparison result outputted from the phase comparator 400 have substantially the same level, a delay locking operation from outputs of the delay lines are performed. However, if the two signals RCTRL and FCTRL of the comparison result outputted from the phase comparator 400 have substantially different levels, one of the outputs of the delay lines is inverted and inputted to the duty compensator 900. That is, when the two signals RCTRL and FCTRL of the comparison result outputted from the phase comparator 400 have substantially different levels, the delay locking operation is performed in response to an inverted signal of the rising delayed clock LR. As a result, it can be prevented that the rising delayed clock LR will be synchronized with a (N+1)th edge of the reference clock RECLK.

As compared with FIGS. 2 and 4, the signals R1 and R2 shown in FIG. 4 can correspond to the signal RCLK shown in FIG. 2, and the signals F1 and F2 can correspond to the signal FCLK.

Referring to FIG. 6, in a first case, there is a normal operation when the temperature variation, the fluctuation of inputted power voltage level, and the change of circumstance and condition are calm. The first case is similar to the normal operation shown in FIG. 3.

Secondly, there is a second case when the temperature variation, the fluctuation of inputted power voltage level, and the change of circumstance and condition are unstable because of starting and finishing a power down mode repeatedly. In this case, the signal RCLK (R1 or R2) based on a Nth rising edge of the first or second rising clock SAR or DR becomes synchronized with a (N+1)th rising edge of the reference clock RECLK, and the signal FCLK (F1 or F2) based on a Nth rising edge of the first or second falling clock SAF or DF is synchronized with a Nth rising edge of reference clock RECLK. Namely, a reference clock for achieving a new locking state is differently applied to the signal RCLK and the signal FCLK.

Lastly, in a third case, when the rising and falling feedback clocks FECLKR and FECLKF have substantially different phases, i.e., the rising and falling feedback clocks FECLKR and FECLKF are in opposite sides of the reference clock, the two signals RCTRL and FCTRL of the comparison result outputted from the phase comparator 400 have substantially different levels. For example, in this case, if the rising feedback clock FECLKR leads the reference clock, the falling feedback clock FECLKF lags the reference clock. At this time, if an inverse signal of the rising delayed clock LR is inputted to the duty compensator 900, the signal RCLK (R1 or R2) based on a Nth rising edge of the first or second rising clock SAR or DR which would be synchronized with the (N+1)th rising edge of the reference clock RECLK can be adjusted to be synchronized with the Nth rising edge of the reference clock RECLK. Therefore, the semiconductor memory apparatus can improve a time distortion of synchronization between the rising and falling clocks outputted from the delay lines 300A and 300B.

Figure 7:
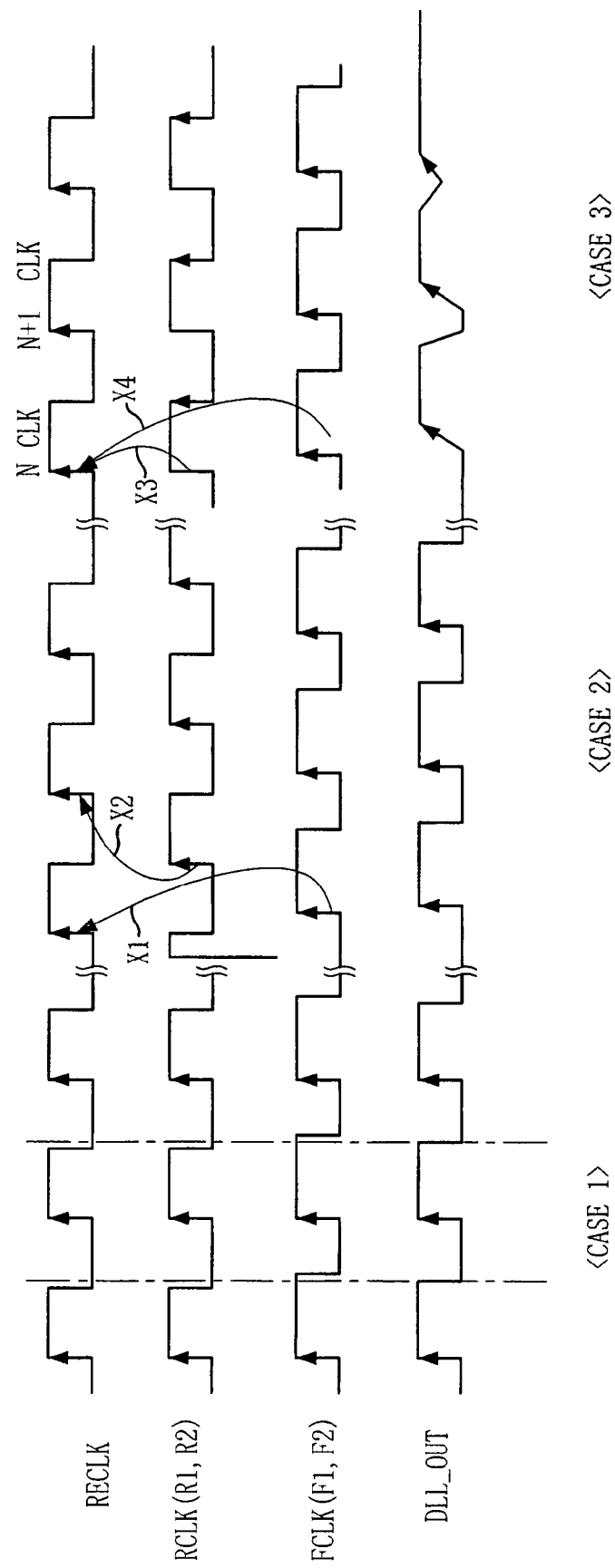
FIG. 7 illustrates a schematic circuit diagram of an embodiment of four clock transmitters shown in FIG. 4.

FIG. 7 illustrates a schematic circuit diagram of an embodiment of the four clock transmitters 710 to 740 shown in FIG. 4.

As shown, the first rising clock transmitter 710 includes two inverters I3 and I4 for buffering the first rising clock signal SAR. The first falling clock transmitter 720 includes three inverters I5 to I7 for inverting the first falling clock signal SAF to generate as the inverse signal F1. Likewise, the second rising clock transmitter 730 and the second falling clock transmitter 740 respectively includes three inverters I8 to I10 and I11 to I13 for inverting the second rising and falling clock signals DR and DF to generate as the inverse signals R2 and F2.

Figure 8:
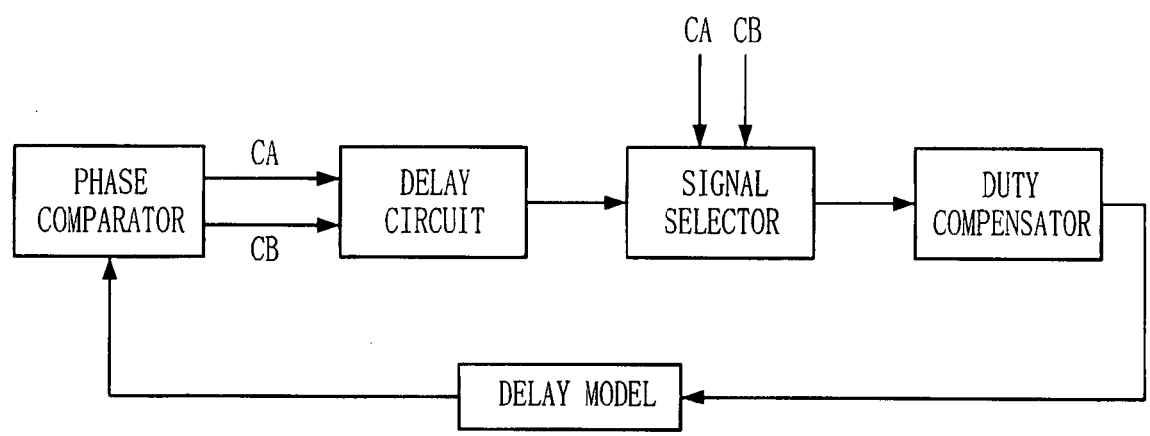
FIG. 8 illustrates a block diagram of a semiconductor memory apparatus according to another embodiment of the present invention.

FIG. 8 illustrates a block diagram of a semiconductor memory apparatus according to another embodiment of the present invention.

As shown, the semiconductor memory apparatus includes a phase comparator, a delay circuit, a signal selector, a duty compensator, and a delay model. Each function block can be similar to the corresponding block of the above described other embodiments of the present invention. Particularly, the signal selector may be constituted with a buffer and an inverter which are controlled by outputs CA and CB from the phase comparator.

Meanwhile, in another embodiment of the present invention, the duty compensator can be not included in the semiconductor memory apparatus. In this case, outputs of the signal selector are directly inputted to the delay model. Further, a duty ratio of delay locked clock may not be compensated, but the signal selector can improve the duty ratio of delay locked clock in response to the outputs CA and CB from the phase comparator.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory apparatus, comprising:
a phase comparator configured to compare phases of rising and falling feedback clocks with that of a reference clock and output a comparison result signal;
a delay circuit configured to delay the reference clock by a predetermined time based on the comparison result signal of the phase comparator to thereby generate rising and falling delayed clocks;
a clock transmission block configured to invert the rising delayed clock outputted from the delay circuit when the rising and falling feedback clocks have substantially different phases when receiving the comparison result signal;
a duty compensator configured to compensate a duty ratio from outputs of the clock transmitting block to generate a delay locked clock having a compensated duty ratio; and
a delay model configured to delay an output and an inverse output of the duty compensator by a modeled delay time respectively to generate the rising and falling feedback clocks.

2. The semiconductor memory apparatus of claim 1, wherein the clock transmission block includes:
a signal selector configured to output the rising and falling delayed clocks as first rising and falling clock signals when the rising and falling feedback clocks have substantially same phases and output the rising and falling delay clocks as second rising and falling clock signals when the rising and falling feedback clocks have substantially different phases;
a first rising clock transmitter configured to transfer the first rising clock signal;
a first falling clock transmitter configured to transfer an inverted first falling clock signal;
a second rising clock transmitter configured to transfer an inverted second rising clock signal; and
a second falling clock transmitter configured to transfer an inverted second falling clock signal.

3. The semiconductor memory apparatus of claim 2, wherein the duty compensator adjusts the duty ratio either from the first rising and falling clock signals or from the second rising and falling clock signals.

4. The semiconductor memory apparatus of claim 2, wherein the signal selector includes:
a comparator configured to generate a transfer control signal enabled when the rising and falling feedback clocks have substantially same phases;
a first transfer gate configured to transfer the rising delayed clock as the first rising clock signal in response to a first logic level of the transfer control signal;
a second transfer gate configured to transfer the falling delayed clock as the first falling clock signal in response to the first logic level of the transfer control signal;
a third transfer gate configured to transfer the rising delayed clock as the second rising clock signal in response to a second logic level of the transfer control signal; and
a fourth transfer gate configured to transfer the falling delayed clock as the second falling clock signal in response to the second logic level of the transfer control signal.

5. The semiconductor memory apparatus of claim 4, wherein the comparator includes plural logic gates for performing an exclusive OR operation on outputs of the phase comparator to thereby detect a phase difference between the rising and falling feedback clocks when receiving the comparison result signal.

6. The semiconductor memory apparatus of claim 1, wherein the clock transmission block includes:
a logic circuit configured to perform an exclusive OR operation on outputs of the phase comparator to thereby detect a phase difference between the rising and falling feedback clocks;
a buffering block configured to transfer the rising and falling delayed clocks in response to an output of the logic circuit; and
an inversion block configured to invert the rising and falling delayed clocks in response to an output of the logic circuit.

7. A semiconductor memory apparatus, comprising:
a phase comparator configured to generate first and second control signals based on differences between phases of rising and falling feedback clocks and that of a reference clock;
a delay line configured to delay the reference clock by a predetermined time based on the first and second control signals to thereby generate rising and falling delayed clocks;
a duty compensation block configured to compensate a duty ratio from an inverted rising delayed clock and the falling delayed clock when the rising and falling feedback clocks have substantially same phases and from the rising and falling delayed clocks when the rising and falling feedback clocks have substantially different phases when receiving the first and second control signals to thereby generate rising and falling delay locked clocks, each having a compensated duty ratio; and
a delay model configured to delay the rising and falling delay locked clocks outputted from the duty compensation block by a modeled delay time respectively to generate the rising and falling feedback clocks.

8. The semiconductor memory apparatus of claim 7, further comprising a delay controller configured to control the predetermined time of the delay time in response to the first and second control signals.

9. The semiconductor memory apparatus of claim 7, wherein the duty compensation block includes:
a signal selector configured to output the rising and falling delayed clocks as first rising and falling clock signals when the rising and falling feedback clocks have substantially same phases and output the rising and falling delay clocks as second rising and falling clock signals when the rising and falling feedback clocks have substantially different phases;
a first rising clock transmitter configured to transfer the first rising clock signal as a first rising signal;
a first falling clock transmitter configured to transfer an inverted first falling clock signal as a first falling signal;
a second rising clock transmitter configured to transfer an inverted second rising clock signal as a second rising signal;
a second falling clock transmitter configured to transfer an inverted second falling clock signal as a second falling signal; and
a duty compensator configured to compensate a duty ratio either from the first rising and falling signals or from the second rising and falling signals in response to outputs of the signal selector to thereby generate the rising and falling delay locked clocks, each having a compensated duty ratio.

10. The semiconductor memory apparatus of claim 9, wherein the signal selector includes:
- a first transfer gate configured to transfer the rising delayed clock as the first rising clock signal;
- a second transfer gate configured to transfer the falling delayed clock as the first falling clock signal;
- a third transfer gate configured to transfer the rising delayed clock as the second rising clock signal;
- a fourth transfer gate configured to transfer the falling delayed clock as the second falling clock signal; and
- a comparator configured to selectively turn on either the first and second transfer gates or the third and fourth transfer gates based on the first and second control signals.

11. The semiconductor memory apparatus of claim 10, wherein the comparator includes plural logic gates for performing an exclusive OR operation on the first and second control signals to thereby detect a phase difference between the rising and falling feedback clocks.

12. A method for generating a delay locked clock having a compensated duty ratio from a semiconductor memory apparatus, comprising:
- comparing phases of rising and falling feedback clocks with that of a reference clock and generating a comparison result signal;
- delaying the reference clock by a predetermined time based on the comparison result signal of the phase comparator to thereby generate rising and falling delayed clocks;
- inverting the rising delayed clock outputted from the delay circuit when the rising and falling feedback clocks have substantially different phases when receiving the comparison result signal;
- compensating a duty ratio from outputs of the clock transmitting block to generate a delay locked clock having a compensated duty ratio; and
- delaying an output and an inverse output of the duty compensator by a modeled delay time respectively to generate the rising and falling feedback clocks.

13. The method of claim 12, wherein the inverting the rising delayed clock and the compensating the duty ratio includes:
- outputting the rising and falling delayed clocks as first rising and falling clock signals when the rising and falling feedback clocks have substantially same phases;
- outputting an inverse rising delay clock and the falling delay clock as second rising and falling clock signals when the rising and falling feedback clocks have substantially different phases; and
- adjusting the duty ratio either from the first rising and falling clock signals or from the second rising and falling clock signals.

14. A method for generating a delay locked clock having a compensated duty ratio from an semiconductor memory apparatus, comprising:
- generating first and second control signals based on differences between phases of rising and falling feedback clocks and that of a reference clock;
- delaying the reference clock by a predetermined time based on the first and second control signals to thereby generate rising and falling delayed clocks;
- compensating a duty ratio from an inverted rising delayed clock and the falling delayed clock when the rising and falling feedback clocks have substantially same phases and from the rising and falling delayed clocks when the rising and falling feedback clocks have substantially different phases when receiving the comparison result signal to thereby generate rising and falling delay locked clocks, each having compensated duty ratio; and
- delaying the rising and falling delay locked clocks outputted from the duty compensation by a modeled delay time respectively to generate the rising and falling feedback clocks.

15. The method of claim 14, wherein the compensating the duty ratio includes:
- outputting the rising and falling delayed clocks as first rising and falling clock signals when the rising and falling feedback clocks have substantially same phases;
- outputting the rising and falling delay clocks as second rising and falling clock signals when the rising and falling feedback clocks have substantially different phases;
- transferring the first rising clock signal as a first rising signal;
- transferring an inverted first falling clock signal as a first falling signal;
- transferring an inverted second rising clock signal as a second rising signal;
- transferring an inverted second falling clock signal as a second falling signal; and
- compensating a duty ratio either from the first rising and falling signals or from the second rising and falling signals in response to outputs of a signal selector to thereby generate the rising and falling delay locked clocks, each having compensated duty ratio.

16. A semiconductor memory apparatus, comprising:
- a phase comparator configured to compare phases of rising and falling feedback clocks with that of a reference clock and generate a comparison result signal;
- a delay line configured to delay the reference clock by a predetermined time to thereby generate rising and falling delayed clocks;
- a delay controller configured to control the predetermined time of the delay line in response to a comparison result of the phase comparator;
- a clock transmission block configured to invert the rising delayed clock outputted from the delay circuit when the rising and falling feedback clocks have substantially different phases when receiving the comparison result signal and buffer the rising and falling delayed clocks when the rising and falling feedback clocks have substantially same phases to thereby output as a delay locked clock; and
- a delay model configured to delay outputs from the clock transmission block by a modeled delay time respectively to generate the rising and falling feedback clocks.

17. The semiconductor memory apparatus of claim 16, wherein the clock transmission block includes:
- a signal selector configured to output the rising and falling delayed clocks as first rising and falling clock signals when the rising and falling feedback clocks have substantially same phases and output the rising and falling delay clocks as second rising and falling clock signals when the rising and falling feedback clocks have substantially different phases;
- a first rising clock transmitter configured to transfer the first rising clock signal;
- a first falling clock transmitter configured to transfer an inverted first falling clock signal;
- a second rising clock transmitter configured to transfer an inverted second rising clock signal; and
- a second falling clock transmitter configured to transfer an inverted second falling clock signal.

18. The semiconductor memory apparatus of claim 17, further comprising a duty compensator configured to adjust a duty ratio either from the first rising and falling clock signals or from the second rising and falling clock signals.

19. The semiconductor memory apparatus of claim 17, wherein the signal selector includes:
- a comparator configured to generate a transfer control signal enabled when the rising and falling feedback clocks have substantially same phases when receiving the comparison result signal;
- a first transfer gate configured to transfer the rising delayed clock as the first rising clock signal in response to a first logic level of the transfer control signal;
- a second transfer gate configured to transfer the falling delayed clock as the first falling clock signal in response to the first logic level of the transfer control signal;
- a third transfer gate configured to transfer the rising delayed clock as the second rising clock signal in response to a second logic level of the transfer control signal; and
- a fourth transfer gate configured to transfer the falling delayed clock as the second falling clock signal in response to the second logic level of the transfer control signal.

20. The semiconductor memory apparatus of claim 16, wherein the clock transmission block includes a buffer and an inverter controlled by the comparison result from the phase comparator.

* * * * *